United States Patent
Dudte et al.

(10) Patent No.: US 7,827,440 B1
(45) Date of Patent: Nov. 2, 2010

(54) RE-SYNCHRONIZING CORRUPTED DATA

(75) Inventors: Christopher P. Dudte, San Jose, CA (US); Michael J. Cornwell, San Jose, CA (US)

(73) Assignee: Apple Inc., Cupertino, CA (US)

( * ) Notice: Subject to any disclaimer, the term of this patent is extended or adjusted under 35 U.S.C. 154(b) by 383 days.

(21) Appl. No.: 12/014,609

(22) Filed: Jan. 15, 2008

Related U.S. Application Data

(60) Provisional application No. 60/984,580, filed on Nov. 1, 2007.

(51) Int. Cl.
*G06F 11/00* (2006.01)
(52) U.S. Cl. .................... 714/6; 714/5; 714/42
(58) Field of Classification Search ............ None
See application file for complete search history.

(56) References Cited

U.S. PATENT DOCUMENTS 7,526,675 B2 * 4/2009 Mambakkam et al. ........ 714/15
2001/0010070 A1   7/2001 Crockett et al.
2002/0114341 A1   8/2002 Sutherland et al.
2007/0168702 A1 * 7/2007 Dickenson et al. ............ 714/6
2008/0318658 A1 * 12/2008 Sylla et al. .................... 463/20
2009/0138109 A1 * 5/2009 Park ........................... 700/94

* cited by examiner

*Primary Examiner*—Michael C Maskulinski
(74) *Attorney, Agent, or Firm*—Fish & Richardson P.C.

(57) ABSTRACT

The subject matter of this specification can be embodied in, among other things, a method that includes identifying and restoring corrupted data stored, for example, on a portable media player. Some of the described implementations include synching a media player with a host device (e.g., a personal computer). During synchronization, the host device can query the media player to determine whether any media stored on the device should be replaced. For example, the host device can determine whether a corruption event occurred in association with a media file (e.g., whether the media player skipped the media file as unplayable). In another example, the host can determine whether portions of a media player's storage device are damage or "bad." If a bad portion is detected, the host device can identify media stored on the portion as corrupt. After identifying corrupted media, the host can replace the media with valid copies.

18 Claims, 5 Drawing Sheets

US 7,827,440 B1

RE-SYNCHRONIZING CORRUPTED DATA

CROSS-REFERENCE TO RELATED APPLICATIONS

This application claims priority under 35 USC §119(e) to U.S. Provisional Patent Application Ser. No. 60/984,580, filed on Nov. 1, 2007, the entire contents of which are hereby incorporated by reference.

TECHNICAL FIELD

This instant specification relates to restoring corrupted data.

BACKGROUND

Media files, such as music files, can be stored on a portable device carried by a user. For example, a user can listen to music files stored on a portable music player. The media files can also be stored on the user's personal computer, which can be synchronized with the portable device. In certain circumstances, however, media stored on the portable device can become corrupted. For example, a music file stored on a portable media player can become corrupt after events such as a power loss while accessing the music file or after physical trauma to the media player.

SUMMARY

In general, this document describes identifying and restoring corrupted data stored, for example, on a portable media player. Some of the described implementations include synching a portable media player with a host device (e.g., a personal computer). During the synchronization, the host device can query the media player to determine whether any media stored on the device should be replaced. For example, the host device can determine whether a corruption event occurred in association with a media file (e.g., whether the media player skipped the media file as unplayable). In another example, the host can determine whether portions of a media player's storage device are damage or "bad." If a bad portion is detected, the host device can identify media stored on the portion as corrupt. After identifying corrupted media, the host can replace the media with valid copies.

The systems and techniques described here may provide one or more of the following advantages. First, corrupted data on a portable device can be restored without manual intervention during a restoration process. Second, corrupted media files can be identified during use of a media player and marked for later restoration when coupled to a host device. Third, user convenience can be increased by permitting a user to purchase media that was corrupted on a portable device and that is not present on the user's home computer. Fourth, corrupted media files can be identified during a hardware scan of memory storing the media files and marked for later restoration when coupled to a host.

The details of one or more embodiments of the restore feature are set forth in the accompanying drawings and the description below. Other features and advantages of the restore feature will be apparent from the description and drawings, and from the claims.

DESCRIPTION OF DRAWINGS

Like reference symbols in the various drawings indicate like elements.

DETAILED DESCRIPTION

This document describes systems and techniques that, for example, replace corrupted media files stored on a portable device, such as a music or video player. In some implementations, the portable device sends an error log to a host device. The host device can use the error log to identify one or more media files or portions of the media files for replacement at the portable device. The host device can transmit the uncorrupted, or valid copies of the media files and/or portions of the media files to the portable device according to one implementation.

Figure 1:
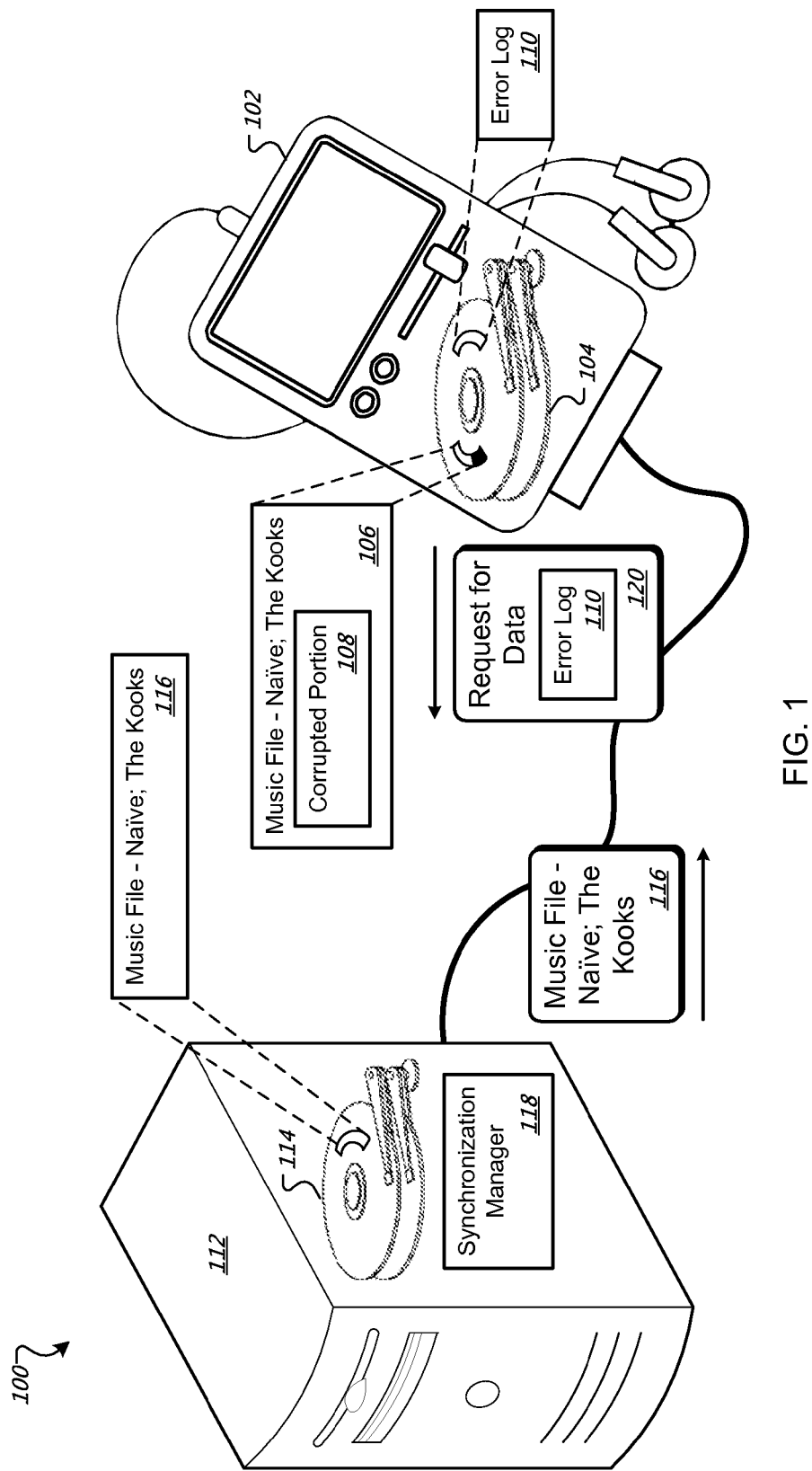
FIG. 1 is a schematic diagram showing an example of a system for replacing corrupted media files on a portable device.

FIG. 1 is a schematic diagram showing an example of a system 100 for replacing corrupted media files on a portable device 102. The portable device 102 may be, for example, a handheld music player and/or video player. The portable device 102 includes a storage device 104. The storage device 104 may be a non-volatile memory, such as a hard disk drive, a flash memory drive, a removable media, or other non-volatile memory. The portable device 102 stores media files within the storage device 104, such as a music file 106 including a song entitled "Naïve" by a group named "The Kooks."

In the example, the music file 106 includes a corrupted portion 108. The corrupted portion 108 of the music file 106 includes data that is corrupted. The corruption may be the result of, for example, a corruption event, such as dropping the portable device 102 on a hard surface, having a power disturbance while accessing the data, or due to a hardware failure of the storage device at the portion storing the data. In some implementations, the corrupted portion 108 prevents playback of the music file 106. The portable device 102 can record the existence of the corrupted portion 108 in an error log 110, as shown in the example of FIG. 1.

In some implementations, the error log 110 includes a record of corrupted media file portions within the storage device 104. The error log 110 can identify, for example, physical locations within the storage device 104 that include corrupted data, such as blocks, sectors, or other physical memory location identifiers. Alternatively or in addition, the error log 110 can identify logical locations within the storage device 104 that include corrupted data, such as a file path and/or file name used by a file or device manager.

A user may connect the portable device 102 to a host device 112. The connection may be by way of a physical connection, such as through a Universal Serial Bus (USB) cable, or a wireless connection, such as through a Bluetooth wireless network.

The host device 112 includes or has access to a storage device 114. For example, the host device 112 can include a personal computer of a user that has a non-volatile memory, such as a magnetic hard disk. The storage device 114 can store media files, such as a copy 116 of the music file 106. In some implementations, the host device 112 includes a synchronization manager 118, which synchronizes files between the portable device 102 and the host device 112. For example, the personal computer can include a media manager that manages music, videos, photographs, etc., for a user and synchronizes media stored on the personal computer with media stored on a portable media player.

In some implementations, the portable device 102 sends a request for data 120 to the host device 112. For example, the request for data 120 can include the error log 110. In some implementations, the request for data 120 is in response to an establishment of a connection between the portable device 102 and the host device 112. In another example, the host device 112 may send a command to the portable device 102 initiating the request for data 120 at some time after a connection between the host device 112 and the portable device 102 is established.

In some implementations, the synchronization manager 118 can use information within the request for data 120, such as the error log 110, to identify one or more media files to replace, where the media files correspond to corrupted media files within the portable device 102. For example, the synchronization manager 118 can identify the music file 106 as having the corrupted portion 108. Next, the synchronization manager 118 can identify the copy 116 to replace the music file 106. The synchronization manager 118 can transmit the copy 116 to the portable device 102. In other implementations, the synchronization manager 118 sends the entire copy 116 to replace the entire media file 106 that includes the corrupted portion.

In some implementations, the synchronization manager 118 sends a portion of the copy 116 to replace only a portion of the media file 106. For example, the media file 106 may be a large video file that has a small portion that is corrupted. Instead of replacing the entire video file—which may be a lengthy process—the synchronization manager 118 can replace only the corrupted portion. In another example, the synchronization manager 118 can replace a segmented portion of the video file that includes the corrupted portion 108. For example, if the corrupted portion is within a single chapter of a video file, the synchronization manager 118 can transmit the single chapter to replace the corrupted chapter.

Figure 2:
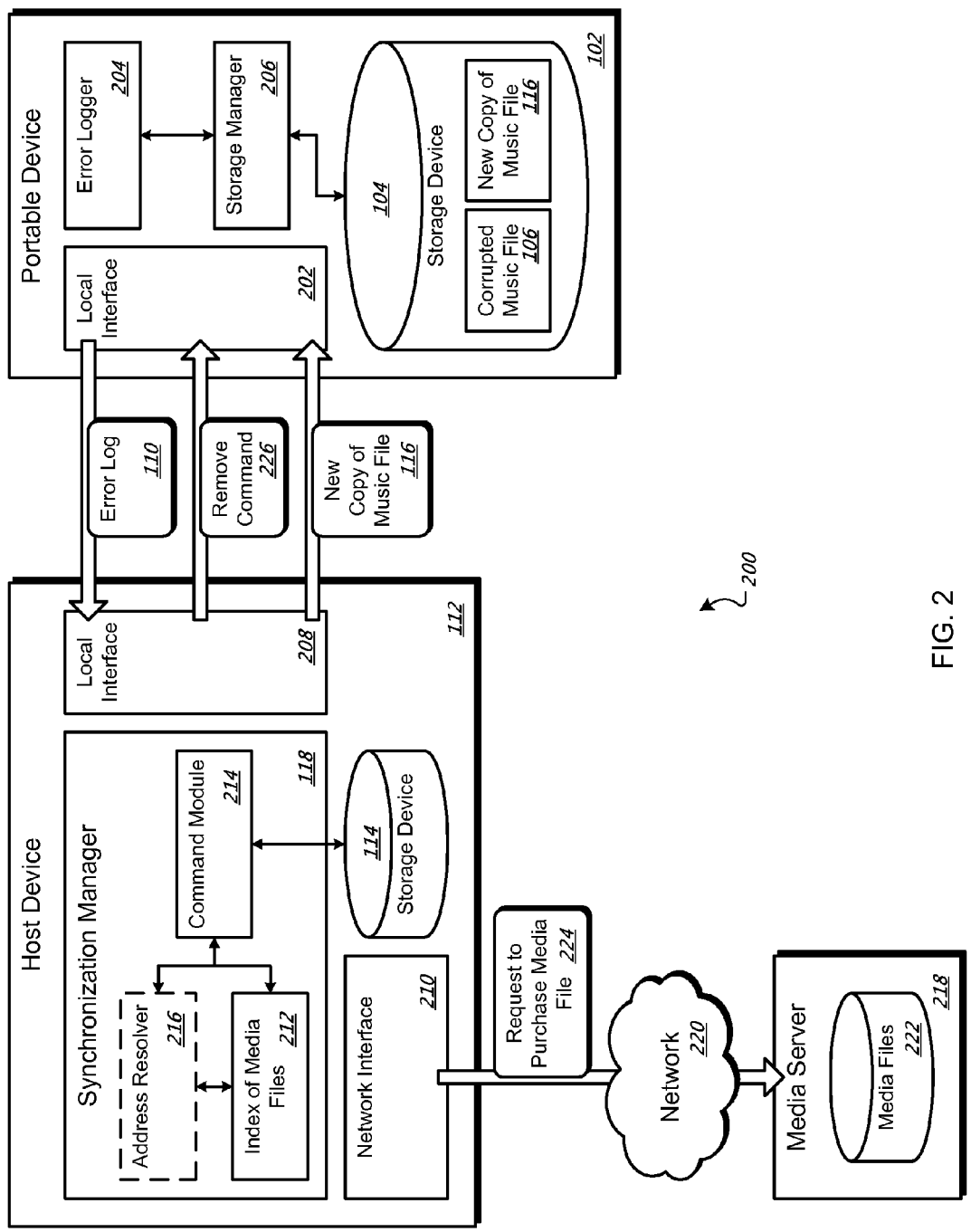
FIG. 2 is a block diagram showing an example of a system for replacing corrupted media files on a portable device.

FIG. 2 is a block diagram showing an example of a system 200 for replacing corrupted media files on the portable device 102. The system 200 can include the portable device 102 and the host device 112.

In the example shown in FIG. 2, the portable device 102 includes a local interface 202, an error logger 204, and a storage manager 206. In some implementations, the portable device 102 is in communication with the host device 112 through the local interface 202. The storage manager 206 manages access to the storage device 104. The storage manager 206 can report to the error logger 204 errors that occur while performing read operations of the storage device 104. The error logger 204 records the errors in the error log 110.

In some implementations, the storage manager 206 verifies the validity of media files in the storage device 104 by accessing each media file included in a list of media files. For example, the portable device 104 can access data associated with music or video files listed in a media index that includes all the media files stored on the portable device 104. The verification may be in response to a request from the host device 112, connection of the host device 112 to the portable device 102, or a corruption event, such as dropping the portable device 102 or power loss. In some implementations, the verification can be scheduled or performed periodically. After connection to the host device 112, the portable device 102 sends the error log 110 resulting from the verification to the host device 112 through the local interface 202.

In some implementations, the host device 112 includes a local interface 208 and a network interface 210. The host device 112 can communicate with the portable device through the local interface 208. As previously described, the local interface 202 and the local interface 208 can include interfaces, such as USB interfaces and/or Bluetooth interfaces. For example, the host device 112 may receive the error log 110 from the portable device 102 through the local interface 208. The error log 110 is processed by the synchronization manager 118.

In other implementations, the interface is not limited to a local interface. For example, the interface can be a wireless or wireline interface, where a connection is established between the host device and the portable device regardless of the distance between the devices.

The synchronization manager 118 includes, in certain implementations, an index of media files 212 stored on the host device 112 and a command module 214. In some implementations, the synchronization manager 118 also includes an address resolver 216 indicated using dashed lines.

In some implementations, the error log 110 includes a physical location or address of the corrupted portion 108. The address resolver 216 can use the physical location of the corrupted portion 108 to resolve a logical address of the music file 106 on the portable device 102, such as a file name and/or path. For example, the address resolver can store information that specifies what media files are stored at different locations of storage device 104 of the portable device 102. The address resolver 216 determines an identifier of the music file 106 using the logical address. For example, the address resolver 216 may use the path, a portion of the path, the file name, the file size, or meta-data associated with the music file 106 to determine the identifier of the music file 106.

The address resolver 216 can check for the identifier in the index of media files 212 according to certain implementations. For example, the index of media files 212 can include a list of media files accessible by the host device 112. The media files accessible by the host device 112 can be included in the storage device 114 or an external system, such as a media server 218.

In certain implementations, the host device 112 and the media server 218 are in communication through a network 220, such as a local area network (LAN), a wide area network (WAN), or the Internet. The media server 218 can include one or more media files 222. In some implementations, where the address resolver 216 determines that the copy 116 is not located on the host device 112 but is located in the media files 222 of the media server 218, the synchronization manager 118 may present an interface to a user of the host device 112, where the user can purchase the copy 116 from the media server 218. If the user makes an input to purchase the copy 116, then the synchronization manager 118 sends a request to the media server 218 to purchase media file 224. The media server 218 processes the request to purchase media file 224 and sends the copy 116 to the host device 112.

In other implementations, the host device 112 can retrieve the copy without purchasing the copy. For example, a copy of the media file can be stored on a media server for backup purposes. If the media file is not on the host device, then the host device queries the media server to determine if it has a copy of the media file. If so, the media server can return the media file without cost and/or interaction with a user.

In other implementations, the user can store settings that indicate a pre-approval for purchases from the media server.

For example, the user can store settings that specify a budget permitted for purchases. If the budget is not exceeded, the host device can purchase the copy 116 from the media server 218.

In another implementation, the media server 218 can be another computer on a user's local network. For example, a user can have a central media server that stores television shows, music, images, or other media. If the copy 116 is not present on the host device 112, the host device can query other computers connected to the user's local network to determine if the copy 116 stored on one of the other networked computers.

As shown in FIG. 2, the command module 214 can receive the copy 116 from the media server 218 or retrieve the copy 116 from the storage device 114, as previously described using the identifier of the music file 106. The command module 214 sends the copy 116 to the portable device 102. In some implementations, the command module 214 also sends a remove command 226 to the portable device 102. The remove command 226 can instruct the portable device 102 to remove, or erase, the music file 106 that includes the corrupted portion 108. In another implementation, the portable device 102 can remove the music file 106 in response to generation of the error recorded in the error log 110 or in response to receiving the copy 116.

Figure 3:
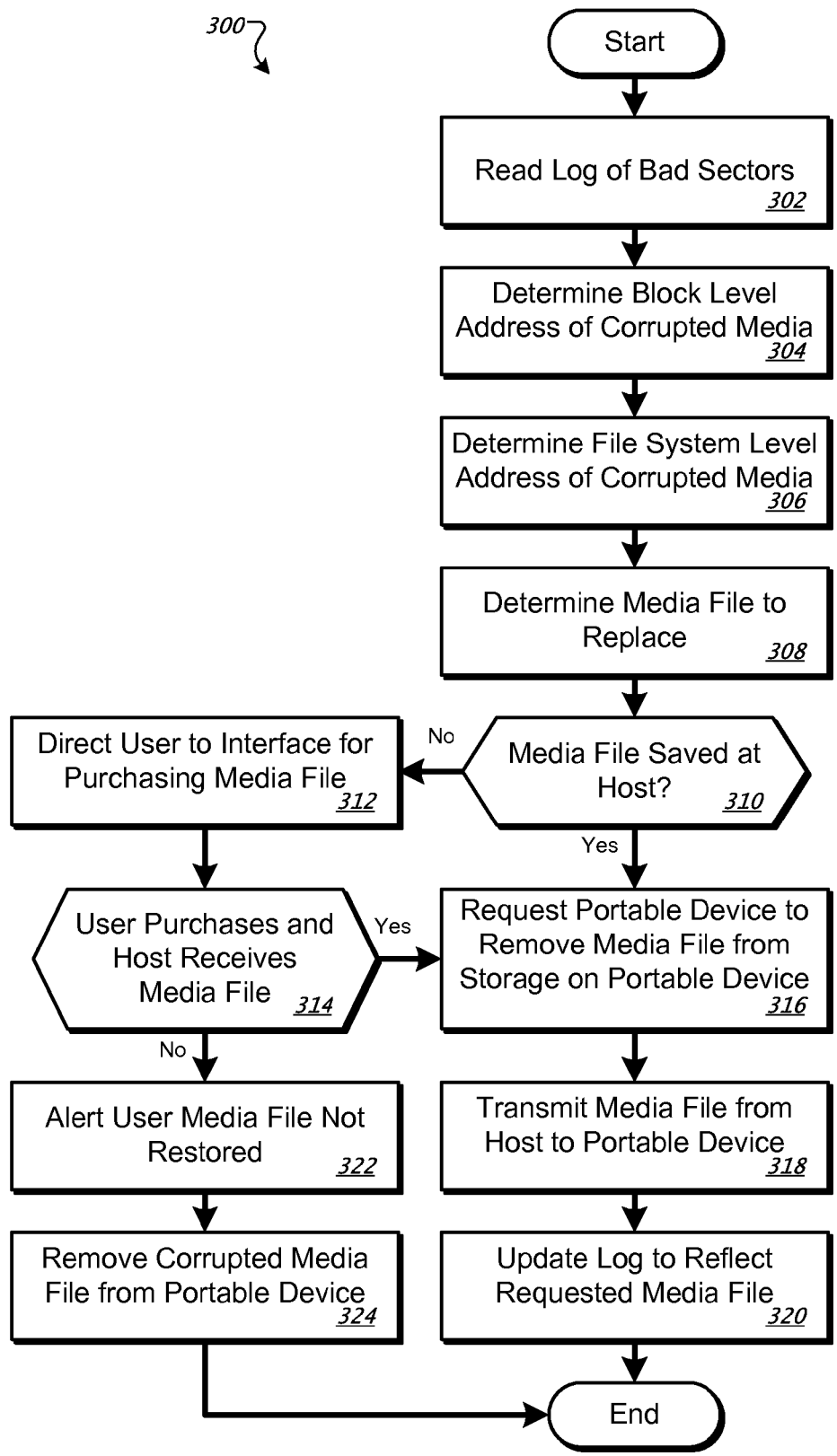
FIG. 3 is a flow chart showing an example of a process for replacing corrupted media files on a portable device.
Figure 4:
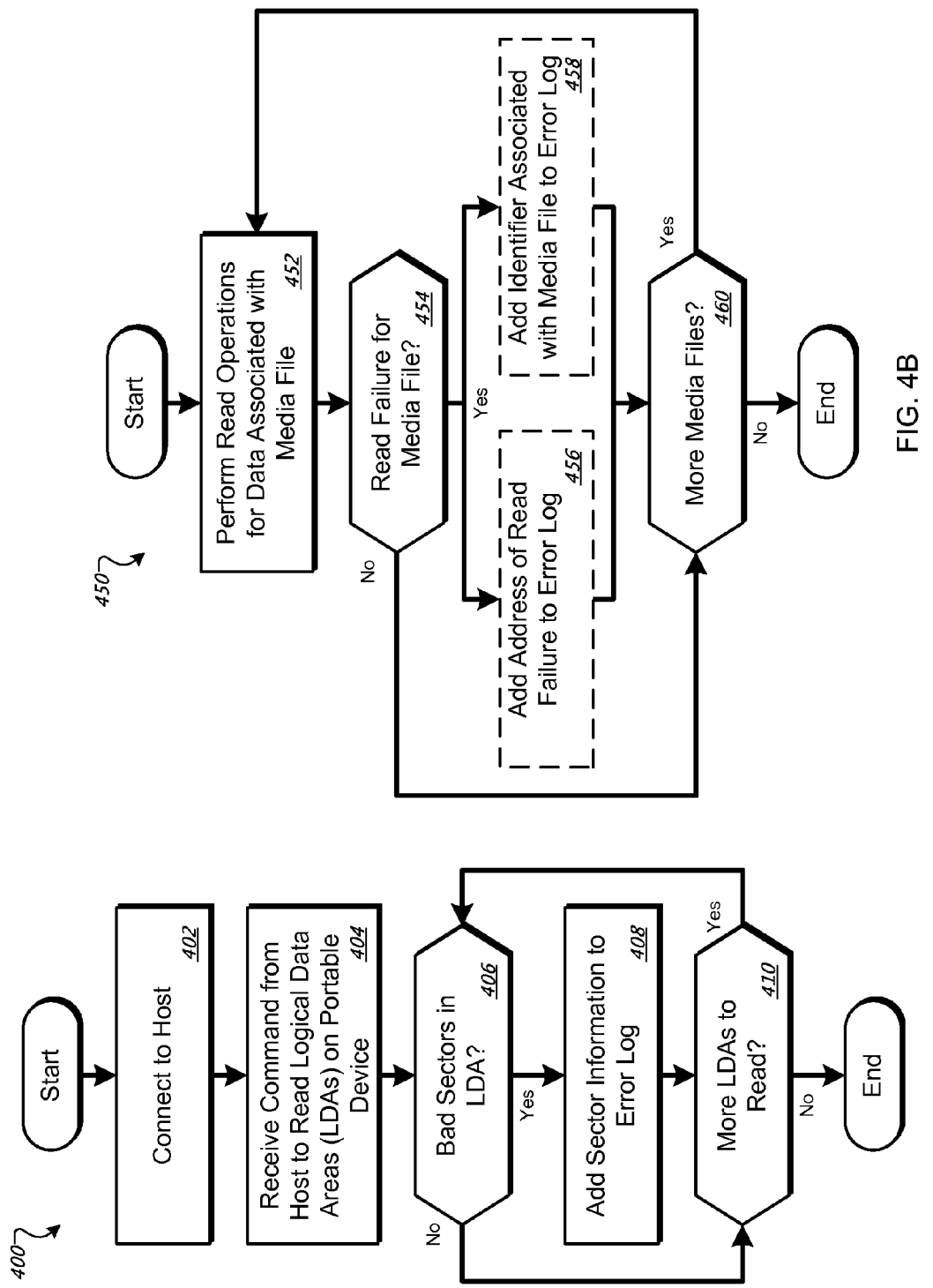
FIG. 4A is a flow chart showing an example of a process for creating an error log based on memory hardware failures on a portable device.
FIG. 4B is a flow chart showing an example of a process for creating an error log of occurrences that media files fail to play properly on a portable device.

FIG. 3 is a flow chart showing an example of a process 300 for replacing corrupted media files on a portable device. FIG. 4A is a flow chart showing an example of a process 400 for creating an error log based on memory hardware failures on a portable device. FIG. 4B is a flow chart showing an example of a process 450 for creating an error log of occurrences that media files fail to play properly on a portable device.

The processes 300, 400, and 450 can be performed, for example, by a system such as the systems 100 and 200. For clarity of presentation, the description that follows uses the systems 100 and 200 as the basis of an example for describing the processes 300, 400, and 450. However, another system, or combination of systems, can be used to perform the processes 300, 400, and 450.

Referring to FIG. 3, the process 300 reads (302) a log of bad sectors from a storage device within a portable device. For example, the address resolver 216 can read the error log 110 generated based on errors that occurred when accessing the storage device 104 within the portable device 102.

The process 300 determines (304) a block level address of a corrupted media file. For example, the address resolver 216 may determine the physical address associated with an error in the error log 110.

The process 300 determines (306) a file system level address of the corrupted media file. For example, the address resolver 216 may determine a logical address and/or identifier of the music file 106 associated with the error. The address resolver 216 can, for example, translate the physical address into a logical address using a calculation or retrieve the logical address from a table of addresses using the physical address.

The process 300 determines (308) a media file to replace the corrupted media file. For example, the address resolver 216 uses the index of media files 212 to identify the copy 116 as a replacement for the music file 106.

In some implementations not shown in FIG. 3, an identifier of the corrupted media file is determined by the portable device. For example, the storage manager 206 may determine that the music file 106 is corrupt and record the identifier of the music file in the error log 110. The storage manager 206 may record file access errors during operation of the portable device 102 and/or during a verification of the files and data stored in the storage device 104.

If the media file is not saved (310) at a host device, then the process 300 can optionally direct (312) a user to an interface for purchasing the media file. For example, the synchronization manager 118 may direct the user to the interface for purchasing the copy 116 from the media server 218.

If the user purchases the media file and the host device receives (314) the media file or if the media file was already saved (310) at the host device, then the process 300 requests (316) that the portable device remove the corrupted media file from the storage device. For example, the command module 214 sends the remove command 226 to the portable device 102.

The process 300 transmits (318) the media file from the host device to the portable device. For example, the synchronization manager 118 transmits the copy 116 to the portable device 102.

The process 300 updates (320) the log of bad sectors to reflect the replaced media file. For example, the storage manager 206 and/or the error logger 204 may update a list of corrupt files to indicate that the music file 106 or files located at the corrupted portion 108 of the storage device 104 have been replaced.

If the user does not purchase the media file or the host device does not receive (314) the media file, then the process 300 can alert (322) the user that the media file was not restored. For example, the synchronization manager 118 may alert the user of the host device 112 that the music file 106 was not replaced.

The process 300 removes (324) the corrupted media file from the storage device. For example, the command module 214 may send the remove command 226 to the portable device 102.

Referring to FIG. 4A, the process 400 includes a connection (402) to a host device. For example, the a portable media player can connect to the a personal computer.

The process 400 includes receiving (404) a command from the host device to read logical data areas (LDAs) on a storage device within a portable device. For example, the portable device 102 may receive a command from the command module 214 to read LDAs of flash memory or a hard disk within the portable device 102.

If a logical data area includes (406) a bad sector, then the process 400 can include adding (408) information regarding the bad sector to an error log. For example, if the storage manager 206 locates a bad sector or physical location within the storage device 104, then the storage manager 206 instructs the error logger 204 to record an error in the error log 110.

If there is another (410) logical data area to be checked, then the process 400 can include determining if the additional logical data area includes (406) a bad sector. Otherwise, if there is not another (410) logical data area, then the process 400 can end.

Referring to FIG. 4B, the process 450 can include performing (452) read operations for data associated with a media file. For example, instead of performing read operations in a sequential manner based on a physical structure of the storage device 104, the storage manager 206 can perform read operations of the storage device 104 based on media files. For instance, the storage manager may access data associated with all media files included in a media index stored on the portable device 102 regardless of where the data is physically stored on the storage device 104.

If there is a read failure (454) for the media file, then the process 450 optionally adds (456) an address of the read failure to an error log and/or optionally adds (458) an identifier associated with the media file to the error log. For example, if the storage manager 206 has a read failure while reading the music file 106 then the error logger 204 may record the physical and/or logical address of the read failure in the error log 110.

If there is another (460) media file that has not been accessed, then the process 450 performs (452) read operations for that media file. Otherwise, if there is not another (460) media file, then the process 450 can end.

Figure 5:
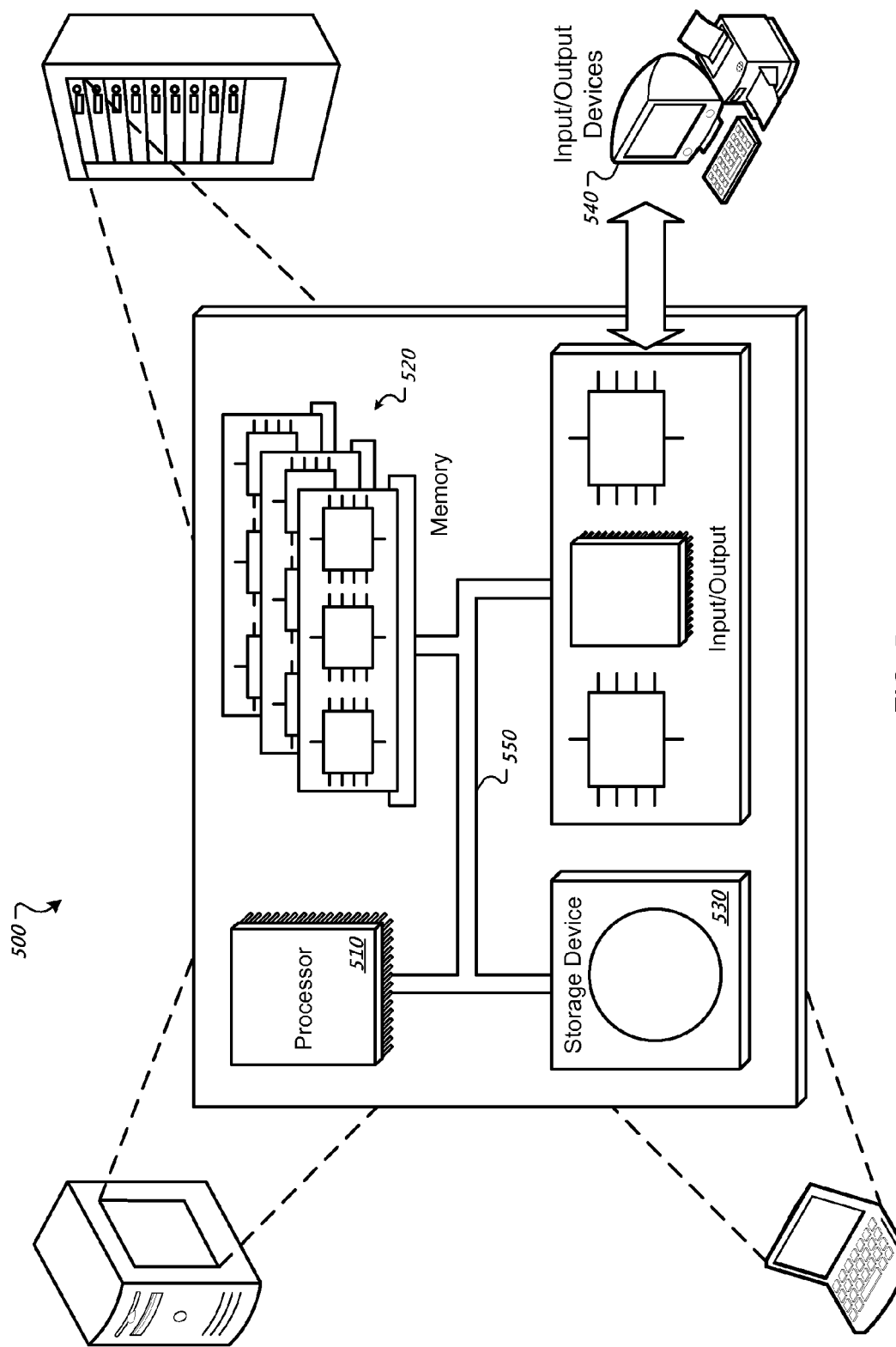
FIG. 5 is a schematic diagram of a computing system that can be used in connection with computer-implemented methods described in this document.

FIG. 5 is a schematic diagram of a generic computer system 500. The system 500 can be used for the operations described in association with any of the computer-implement methods described previously, according to one implementation. The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device or in a propagated signal, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

Although a few implementations have been described in detail above, other modifications are possible. For example, the portable device 102 may identify the copy 116 to replace the music file 106 and the portable device 102 may connect to the media server to retrieve the copy 116. In another implementation, the portable device 102 identifies an identifier of a media file that is corrupted. The host device can use the identifier to retrieve the copy instead of determining the identifier based on either logical or physical address information transmitted by the portable device 102.

In addition to including media players, the portable device 102 can include other devices that include media but perform other functions as well. For example, the portable device 102 can include a cell phone, a personal digital assistance, or a portable email device. In yet other implementations, the media server 218 performs the operations performed in the previously described examples by the host device 112.

As previously discussed, the host device can restore a local file that has been identified as corrupted by replacing the entire file with the corresponding source file stored on the host device. In certain implementations, a corrupted local file can be replaced on the mobile, or client, device by overwriting the local file or by deleting the corrupted local file and storing a new local file based on the corresponding source file stored on the host device. In an implementation, the type of restoration used can depend on the type of corruption detected. For example, if the local file corruption was indicated by a read/write error generated by the storage device, the local file can be deleted and the restored file can be written to a new location of the storage device. Otherwise, the corrupted local file can be overwritten. Alternatively, the host device can restore the corrupted file by replacing one or more portions of the local file at which corruption has been detected. As with replacing the entire local file, the one or more portions of the corrupted local file are restored using a corresponding source file stored on the host device.

The host device also can be configured to validate the restored local file on the client device. For example, the host device can attempt to access the entire local file to confirm that it was properly stored on the client device. If one or more physical storage locations associated with the corrupted local file are damaged, overwriting the local file will not eliminate the corruption. Thus, during validation, the host device can determine that the local file has not been properly restored. The host device can then delete the local file and copy the corresponding source file to a new physical storage location on the client device. Further, the operating system or an application of the host device can mark the damaged physical storage location of the client device to prevent future use of that location. Alternatively, the operating system or an application of the client device can be configured to mark the damaged physical storage location of the client device.

In another implementation, the host device can be configured to determine the number of times a particular local file has been identified as corrupted by the client device. For example, a counter can be maintained by the host device or the client device to track the number of times a particular file has been restored. Alternatively, the host device can be configured to determine the number of times a particular source file has been used to restore a local file. In an implementation, if the host device is associated with a plurality of client devices, the host device can be configured to track the number of times a particular source file has been used to restore a local file associated with any of the associated client devices. In another implementation, the counter can be reset after a predetermined period of time has passed.

In certain situations, the source file also can be corrupted. Thus, the source file stored on the host device can be replaced if it has been used to restore a corresponding local file on one or more client devices more than a predetermined number of times. For example, a source file can be replaced if the corresponding local file on the client device has been replaced three times or if the corresponding local file on a plurality of client devices has been replaced five times. Further, the threshold for replacing a source file on the host device can be set to any number.

The source file stored on the host device can be replaced with a copy of a corresponding master file. For example, the host device can communicate with a file server that is connected to a network by a network connection. Once communication has been established, the host device can replace the source file with a corresponding master file stored on the file server. A user also can be prompted to provide a copy of the master file corresponding to the source file that is being replaced, such as by inserting a CD or DVD on which the master file is stored into a CD/DVD drive associated with the host device or the file server.

Further, in other implementations, the client device can detect whether corruption is present in the local file being accessed. Corruption in the local file can be detected by an application that is processing data associated with the local file. For example, an application configured to perform playback of an audio file, such as a song, can attempt to decode audio data stored in the local file. During decoding, the playback application can compare the data read from the local file with a known format. If the data read from the local file differs from the known format, the playback application determines that the local file has been corrupted. For example, a tag or an item of metadata expected to be in the local file can be missing, or the structure of a header can be incorrect. Further, error detection information included in the file, such as a cyclic redundancy check (CRC), can indicate the presence of corruption. The playback application also can detect an error in file system metadata associated with the local file, such as a broken pointer or a pointer to an incorrect storage location.

In yet other implementations, corruption in the local file can be detected by a user to whom content corresponding to the local file is presented. For example, a user listening to the playback of an audio file can detect an artifact in the local file that is caused by corruption, such as a skip or distortion. Upon identifying the artifact, the user can provide input to the client device identifying the presence of corruption in the local file. For example, the user can actuate a predetermined control or control combination to indicate that the presently accessed file has been corrupted. Additionally, corruption in the local file can be detected while the local file is being retrieved from the storage device. For example, the storage device can output a read/write error identifying corruption at a particular location used to store data associated with the local file. Further, the read/write error can indicate one or more portions of the storage device that are affected, such as a sector or memory cell.

In some implementations, if the client device does not detect corruption, the client device continues to access one or more local files. If corruption is detected, the client device can terminate further access of the local file containing the detected corruption. For example, playback of an audio file can be terminated if it is determined that the audio file has been corrupted. In another implementation, the local device can continue to access the local file and can process any remaining uncorrupted data. For example, playback of the audio file can continue until completed or until input is received from a user terminating the playback.

In certain implementations, the client device also can associate a corruption indicator with the local file in which the corruption was detected. The corruption indicator can be implemented as metadata included in the local file. For example, a corruption flag or one or more control bits included in the local file can be set to indicate that the local file has been corrupted. The corruption indicator also can be implemented such that it is separate from the local file. For example, a database or a file list can be used to identify any local files stored on the client device that have been corrupted. When a corrupted local file is detected, a unique identifier associated with the local file can be inserted into a list of corrupted files or a corruption field associated with the local file can be set in a database. Further, the corruption indicator can be implemented in the file system, such as by associating the corruption indicator with the local file name or a directory in which the local file is stored. Alternatively, upon the detection of corruption, the local file can be deleted.

In yet other implementations, the host device further can determine whether to restore the corresponding source file before restoring the corrupted local file. For example, if the source file has been used to restore the corresponding local file stored on the client device a predetermined number of times, such as three, the source file can be restored. Similarly, if the source file has been used to restore corresponding local files on a plurality of client devices a predetermined number of times, such as five, the source file also can be restored. Thus, a source file that potentially has been corrupted can be restored before the local file associated with the client device is restored. In an implementation, the count indicating the number of times a source file has been used to restore a local file also can be reset after a predetermined period of time. In another implementation, the host device can attempt to validate the source file before restoring the source file. For example, the host device can be configured to access the source file and to verify that the content is valid and organized in the proper format. Further, the user also can be prompted to validate the source file. For example, the entire source file, or one or more suspect portions, can be presented to the user for evaluation and the user can provide input indicating whether corruption was detected in the source file during presentation.

In certain implementations, the host device can restore the source file from a corresponding master file. The master file can be retrieved from a file server, such as over a network. For example, the master file can be provided by an on-line store that includes verified master files. Alternatively, the master file can be retrieved from a separate storage device, including a compact disc ("CD") or digital versatile disc ("DVD"). For example, the host device can prompt the user to provide a master or back-up copy of media on which the master file corresponding to the corrupted source file is stored. Further, the master file can be copied to the host device to replace the corrupted source file. The corrupted source file can be overwritten by data corresponding to the master file. Alternatively, the corrupted source file can be deleted and the master file can be copied to the host device as a new source file.

If it is determined that the source file is not to be restored, or once the source file has been restored, the host device can determine whether there is physical corruption associated with the local file. For example, physical corruption can be determined to be present if a read/write error was generated during an access operation associated with the local file. The client device also can associate a physical corruption indicator with the local file. In an implementation, the physical corruption indicator can be generated in addition to the corruption indicator. Alternatively, the corruption indicator can be generated such that physical corruption is distinguishable from logical corruption. In another implementation, the host device can provide the data corresponding to the source file to the client device, which can determine whether to restore the corrupted local file by overwriting or by deletion and replacement to a different storage location.

If the local file has been physically corrupted, the corrupted local file can be deleted and a new local file based on the corresponding source file of the host device is stored at a new storage location on the client device. Otherwise, the corrupted local file can be overwritten with data from the corresponding source file stored on the host device. In an implementation, if data is available that indicates one or more particular portions of the local file that have been corrupted, the local file can be restored by overwriting or replacing only the one or more corrupted portions of the local file. Further, one or more aspects of the corresponding source file can be verified before restoring the corrupted portions of the local file, including the file name, directory path, file type, size, and file date. If the source file cannot be verified as the proper version for use in restoring one or more portions of the corrupted local file, the entire local file can be restored.

A validation operation can then be performed with respect to the restored local file. For example, the client device can access the data associated with the local file and/or process the contents of the local file. Alternatively, the validation operation can be performed by the host device, which also can access the data associated with the local file and/or process the contents of the local file. In an implementation, the user also can be prompted to verify the restored local file. For example, the contents of the local file can be presented to the user, who can provide an input if any corruption is present.

In certain implementations, a corruption event in a client device can be detected and a local file can be validated in response to the detected corruption event. For example, the client device can include one or more shock sensors, including an accelerometer, configured to detect physical shock to the client device, such as an impact. The client device can determine that a corruption event has occurred when an output associated with one or more of the shock sensors exceeds a threshold amount.

Upon determining that a corruption event has occurred, the client device can determine whether a local file was being accessed at the time of the corruption event. If no local files were being accessed, the client device can continue to operate and monitor for corruption events. Otherwise, if a local file was being accessed at the time of the corruption event, the client device can set a corruption event indicator. The corruption event indicator can identify the local file that was being accessed at the time of the corruption event. The corruption event indicator also can include additional information, such as one or more storage locations that were being accessed at the time of the corruption event and one or more portions of the local file that were being accessed at the time of the corruption event. Alternatively, the detected corruption event can cause a corruption indicator to be associated with the local file being accessed at the time of the corruption event, even though corruption has not been detected in the local file. Further, the corruption indicator generated in response to a corruption event can be processed in the same manner as a corruption indicator generated in response to corruption detected in a local file.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A computer-implemented method comprising:
   identifying, by a portable device, one or more corrupted portions of first digital media stored on the portable device;
   generating an error log that indicates the one or more corrupted portions;
   generating an entry for the error log based on an unsuccessful attempt to play the first digital media;
   coupling the portable device to a host device that has access to a copy of the first digital media; and
   requesting, by the portable device, at least a portion of the copy to replace at least the one or more corrupted portions of the first digital media.

2. The method of claim 1, wherein requesting at least a portion of the copy comprises requesting substantially all of the copy to replace substantially all of the first digital media.

3. The method of claim 1, wherein identifying the one or more corrupted portions comprises performing read operations on a storage device of the portable device to determine physical portions of the storage device that have failed.

4. The method of claim 1, wherein identifying the one or more corrupted portions comprises accessing multiple digital media files identified by a media list to determine if a digital media file has data that is corrupt.

5. The method of claim 1, wherein requesting the at least a portion of the copy comprises transmitting the error log to the host device.

6. The method of claim 1, wherein the error log comprises an identifier for the first digital media.

7. The method of claim 1, wherein identifying the one or more corrupted portions is performed in response to a request by the host device after coupling the portable device to the host device.

8. The method of claim 1, wherein coupling the portable device to the host device comprises establishing a connection using a wireline connection.

9. The method of claim 1, wherein coupling the portable device to the host device comprises establishing a connection using a wireless connection.

10. The method of claim 1, wherein the first digital media is stored on a magnetic disk drive or in flash memory.

11. A computer-implemented method comprising:
   identifying, by a portable device, one or more corrupted portions of first digital media stored on the portable device;
   generating an error log that indicates the one or more corrupted portions, wherein the error log comprises one or more addresses that specify the one or more corrupted portions on a storage device of the portable device;
   coupling the portable device to a host device that has access to a copy of the first digital media; and
   requesting, by the portable device, at least a portion of the copy to replace at least the one or more corrupted portions of the first digital media.

12. The method of claim 11, wherein the host device determines that the one or more corrupted portions are associated with the first digital media using the one or more addresses of the storage device.

13. A computer-implemented method of claim 1, further comprising
   identifying, by a portable device, one or more corrupted portions of first digital media stored on the portable device;
   coupling the portable device to a host device that has access to a copy of the first digital media;
   determining that the copy of the first digital media stored on the host device has been used to restore one or more corrupted portions of the first digital media a predetermined number of times and restoring the copy from a corresponding master file before restoring the one or more corrupted portions of the first digital media on the portable device; and
   requesting, by the portable device, at least a portion of the copy to replace at least the one or more corrupted portions of the first digital media.

14. A computer-implemented method comprising:
   receiving an indication that a portable device having a memory storing media files is connected to a host device through an interface;
   requesting from the portable device an error log that indicates a corrupted portion of the memory;
   determining one or more media files associated with the corrupted portion;
   determining whether the valid copy of the determined one or more media files is stored at the host device;
   transmitting a request to retrieve the one or more media files from a remote system if the one or more media files are not stored at the host device; and
   transmitting, to the portable device, a valid copy of the determined one or more media files.

15. The method of claim 14, wherein the request includes a request to purchase the one or more media files from the remote system.

16. The method of claim 15, further comprising transmitting a request for approval of the purchase to a user associated with the host device.

17. A computer-implemented method comprising:
   receiving an indication that a portable device having a memory storing media files is connected to a host device through an interface;
   requesting from the portable device an error log that indicates a corrupted portion of the memory;
   determining one or more media files associated with the corrupted portion, wherein determining the one or more media files comprises using a media index that correlates a memory address in the error log with the one or more media files; and
   transmitting, to the portable device, a valid copy of the determined one or more media files.

18. A computer program product tangibly embodied in a computer readable medium, the computer program product including instructions that, when executed, perform operations for replacing corrupted data, the operations comprising:
   receiving an indication a portable device having a memory storing media files is connected to a host device through an interface;
   requesting from the portable device identifiers associated with a corrupted portion of the memory;
   determining one or more media files associated with the corrupted portion;
   determining whether the valid copy of the determined one or more media files is stored at the host device;
   transmitting a request to retrieve the one or more media files from a remote system if the one or more media files are not stored at the host device; and
   transmitting to the portable device a valid copy of the determined one or more media files.

* * * * *

UNITED STATES PATENT AND TRADEMARK OFFICE
CERTIFICATE OF CORRECTION

| | | |
|---|---|---|
| PATENT NO. | : 7,827,440 B1 | Page 1 of 1 |
| APPLICATION NO. | : 12/014609 | |
| DATED | : November 2, 2010 | |
| INVENTOR(S) | : Christopher P. Dudte et al. | |

It is certified that error appears in the above-identified patent and that said Letters Patent is hereby corrected as shown below:

In column 6, line 36, delete "the a" and insert -- a --, therefor.

In column 6, line 37, delete "the a" and insert -- a --, therefor.

In column 13, lines 37-38, in Claim 13, delete "of claim 1, further comprising" and insert -- comprising: --, therefor.

Signed and Sealed this
Twenty-second Day of November, 2011

David J. Kappos
*Director of the United States Patent and Trademark Office*